United States Patent
Han et al.

(10) Patent No.: US 9,564,764 B2
(45) Date of Patent: Feb. 7, 2017

(54) APPARATUS AND METHOD FOR BATTERY MANAGEMENT WITH MALFUNCTION PREVENTION ALGORITHM

(71) Applicant: LG CHEM, LTD., Seoul (KR)

(72) Inventors: Hyun Han, Daejeon (KR); Jin-Seob Kim, Daejeon (KR); Ho-Sang Kwon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 118 days.

(21) Appl. No.: 14/432,030

(22) PCT Filed: Oct. 7, 2014

(86) PCT No.: PCT/KR2014/009440
§ 371 (c)(1),
(2) Date: Mar. 27, 2015

(87) PCT Pub. No.: WO2015/053536
PCT Pub. Date: Apr. 16, 2015

(65) Prior Publication Data
US 2016/0268819 A1    Sep. 15, 2016

(30) Foreign Application Priority Data

Oct. 7, 2013   (KR) .................. 10-2013-0119281
Oct. 6, 2014   (KR) .................. 10-2014-0134309

(51) Int. Cl.
*H02J 7/00*    (2006.01)
*H01M 2/00*    (2006.01)
(Continued)

(52) U.S. Cl.
CPC ........... *H02J 7/0026* (2013.01); *G01R 31/362* (2013.01); *H01M 2/34* (2013.01); *H01M 2/348* (2013.01); *H01M 10/425* (2013.01); *H01M 10/48* (2013.01); *H01M 10/482* (2013.01); *H02J 7/00* (2013.01); *H02J 7/007* (2013.01); *G01R 19/16542* (2013.01); *G01R 31/3658* (2013.01);
(Continued)

(58) Field of Classification Search
CPC ................................ H02J 7/0026; H02J 7/007
USPC ................. 320/112, 134; 429/61; 361/86
See application file for complete search history.

(56) References Cited

U.S. PATENT DOCUMENTS 4,559,510 A * 12/1985 Franz .................. H01H 71/02
                                                335/13
6,501,248 B2 * 12/2002 Fujiwara .............. H02J 7/0031
                                                320/136
(Continued)

FOREIGN PATENT DOCUMENTS

EP    2254189 A1    11/2010
JP    5-130730 A    5/1993
(Continued)

*Primary Examiner* — M'baye Diao
(74) *Attorney, Agent, or Firm* — Birch, Stewart, Kolasch & Birch, LLP

(57) ABSTRACT

Disclosed is an apparatus and method for battery management. The present disclosure may significantly reduce the likelihood that a fuse of a battery pack will be melted based on a voltage value of a battery cell to which an error has occurred. Accordingly, the present disclosure may avoid an economic loss and a time loss that may occur when the fuse is incorrectly melted and the battery pack becomes unusable.

16 Claims, 3 Drawing Sheets

(51) Int. Cl.
    *H02H 3/00*         (2006.01)
    *H01M 2/34*         (2006.01)
    *H01M 10/42*       (2006.01)
    *H01M 10/48*       (2006.01)
    *G01R 31/36*       (2006.01)
    *G01R 19/165*     (2006.01)

(52) U.S. Cl.
    CPC ........... *H01M 2010/4271* (2013.01); *H01M 2010/4278* (2013.01); *H01M 2200/103* (2013.01); *H02J 2007/0037* (2013.01)

(56) References Cited

U.S. PATENT DOCUMENTS

| | | | |
|---|---|---|---|
| 7,679,330 B2 * | 3/2010 | Furuuchi | H02H 7/18 320/134 |
| 8,802,257 B2 * | 8/2014 | Kim | H01M 2/34 429/61 |
| 8,890,483 B2 * | 11/2014 | Nakatsuji | H01M 2/34 320/134 |
| 2005/0242779 A1 | 11/2005 | Yoshio | |
| 2009/0273314 A1 | 11/2009 | Yoshikawa | |
| 2010/0295382 A1 | 11/2010 | Tae et al. | |
| 2011/0228436 A1 * | 9/2011 | Lee | H02H 3/08 361/93.7 |
| 2012/0035874 A1 | 2/2012 | Yun et al. | |
| 2013/0163134 A1 * | 6/2013 | Ji | H01M 10/42 361/86 |

FOREIGN PATENT DOCUMENTS

| | | |
|---|---|---|
| JP | 2002-281660 A | 9/2002 |
| JP | 2005-160169 A | 6/2005 |
| KR | 10-2007-0035752 A | 4/2007 |

\* cited by examiner

APPARATUS AND METHOD FOR BATTERY MANAGEMENT WITH MALFUNCTION PREVENTION ALGORITHM

TECHNICAL FIELD

The present disclosure relates to an apparatus and method for battery management, and more particularly, to an apparatus and method for battery management that may prevent a fuse from melting, the fuse for preventing an overcharge caused by a malfunction.

The present application claims priority to Korean Patent Application No. 10-2013-0119281 filed in the Republic of Korea on Oct. 7, 2013 and Korean Patent Application No. 10-2014-0134309 filed in the Republic of Korea on Oct. 6, 2014, the disclosures of which are incorporated herein by reference.

BACKGROUND ART

Recently, the demand of portable electronic products such as laptop computers, video cameras, and mobile phones is dramatically increasing and development of electric vehicles, hybrid electric vehicle, energy storage batteries, robots, and satellites is briskly proceeding, and in keeping with this trend, studies are actively being conducted on high performance secondary batteries that can be recharged and used repeatedly.

Currently, available secondary batteries include nickel-cadmium batteries, nickel-hydrogen batteries, nickel-zinc batteries, lithium secondary batteries, and the like, and among them, lithium secondary batteries are gaining attention in many fields due to advantages of charging and discharging freely in the absence of a memory effect, a very low self-discharge rate, and a high energy density when compared to nickel-based secondary batteries.

Such a secondary battery may be used as a single battery cell, but for use in a high voltage and/or high capacity power storage device, may be used by connecting multiple battery cells in series and/or in parallel. Also, a secondary battery may be used in the form of a battery pack including a plurality of battery cells and various battery management apparatuses to control the overall charging and discharging operations of the battery cells.

In the research and development of the battery pack, safety improvement of the battery pack or the battery cells is sought to achieve. In the event of an electrolyte decomposition reaction and a thermal runaway phenomenon caused by heat generated due to an internal short circuit, overcharge, overdischarge, or other reasons, the battery cell may explode due to a rapid increase in internal pressure. Particularly, the battery management apparatus provided in the battery pack measures and monitors the voltage for each battery cell to prevent an explosion accident caused by overcharge. If the voltage of the battery cell exceeds a threshold voltage, that is, if the battery cell is overcharged, the battery management apparatus turns off a charge/discharge switch installed on a charge/discharge line of the battery pack to interrupt a high current path. Also, if this protection measure fails, a fuse installed on the charge/discharge line of the battery pack works to protect the battery cell from damage that may subsequently occur due to overcharge. That is, when the battery management apparatus determines that there is a risk of explosion in the battery cell due to overcharge, the battery management apparatus melts the fuse installed on the charge/discharge line of the battery pack to break a circuit to prevent the battery cell from being charged any longer.

The management apparatus transmits and receives data to and from an external device via a communication line to execute various control algorithms. Thus, the management system is generally manufactured in the form of an integrated circuit (IC). However, with the recent development of wireless Internet and use of a high output battery pack, noise or electromagnetic waves of various frequencies may affect the IC. As a result, an error may occur while the IC is measuring the voltage of the battery cell.

If the battery management apparatus determines that the battery cell is overcharged based on an incorrectly measured voltage value and melts the fuse installed on the charge/discharge line, the battery pack becomes unusable. In this case, to render the battery pack usable, a manufacturer or an operator should pick up the battery pack, check the state of the battery cell, and then replace the fuse.

As described in the foregoing, when the fuse included in the battery pack is melted to break a circuit based on an incorrectly measured voltage base, an economic loss and a time loss is considerable. Accordingly, there is a rising need for an algorithm that may reduce the likelihood that a malfunction will occur during a battery cell voltage measuring operation and even a fuse melting operation.

DISCLOSURE

Technical Problem

The present disclosure is designed to solve the above problem, and therefore, the present disclosure is directed to providing an apparatus and method for battery management with a configuration and an algorithm for preventing a fuse from being irreversibly melted based on an incorrectly measured voltage value.

Technical Solution

To achieve the above object, an apparatus for battery management according to one aspect of the present disclosure includes a fuse provided on a charge/discharge line of a battery pack, an auxiliary control unit configured to measure a voltage of a battery cell included in the battery pack, and when the measured voltage value, or a first voltage value is higher than a preset first reference voltage value, to output a melting signal, or a signal for melting the fuse, and a main control unit configured to measure the voltage of the battery cell included in the battery pack, and when a first condition is satisfied and a second condition is satisfied, to melt the fuse, the first condition in which the measured voltage value, or a second voltage value is higher than a preset second reference voltage value and the second condition in which the melting signal is received from the auxiliary control unit.

The main control unit may be configured to determine whether the first condition is satisfied, after the second condition is satisfied.

The main control unit may be configured to output a malfunction signal indicating that the auxiliary control unit has malfunctioned, when the second condition is satisfied and the first condition is not satisfied.

The apparatus for battery management may further include a first line electrically connecting the auxiliary control unit to the fuse, a second line branched off from the first line, the second line electrically connecting a first node to the main control unit, the first node being a branch of the first line and the second line, and a fuse switch provided on the first line connecting the first node to the fuse, the fuse switch being turned on by the control of the main control unit, and the main control unit may be configured to turn on the fuse switch to allow the melting signal outputted from the auxiliary control unit to flow into the fuse to melt the fuse, when the first condition and the second condition are satisfied.

The auxiliary control unit may include a voltage measurement module configured to measure the voltage of the battery cell, an analog-to-digital (A/D) converter configured to convert the measured voltage value to a digital voltage value, and a memory unit configured to store the measured voltage value and a preset reference voltage value.

The main control unit may include a voltage measurement module configured to measure the voltage of the battery cell, an A/D converter configured to convert the measured voltage value to a digital voltage value, and a memory unit configured to store the measured voltage value and a preset reference voltage value.

To achieve the above object, a battery pack according to another aspect of the present disclosure includes the above apparatus for battery management and a plurality of battery cells connected in series or in parallel.

To achieve the above object, an energy storage system according to another aspect of the present disclosure includes the above battery pack.

To achieve the above object, a battery charging system according to another aspect of the present disclosure includes the above battery pack and a charger to supply power to the battery pack.

To achieve the above object, a battery operating system according to another aspect of the present disclosure includes the above battery pack and a load which is supplied with power from the battery pack.

To achieve the above object, a method for battery management according to another aspect of the present disclosure includes measuring, by an auxiliary control unit, a voltage of a battery cell included in a battery pack, outputting, by the auxiliary control unit, a melting signal, or a signal for melting a fuse when the measured voltage value, or a first voltage value is higher than a preset first reference voltage value, measuring, by a main control unit, the voltage of the battery cell included in the battery pack, determining, by the main control unit, whether a first condition is satisfied and a second condition is satisfied, the first condition in which the measured voltage value, or a second voltage value is higher than a preset second reference voltage value and the second condition in which the melting signal is received from the auxiliary control unit, and melting, by the main control unit, the fuse when the first condition and the second condition are satisfied.

The determining by the main control unit may include determining whether the first condition is satisfied, after the second condition is satisfied.

The method may further include outputting, by the main control unit, a malfunction signal indicating that the auxiliary control unit has malfunctioned, when the second condition is satisfied and the first condition is not satisfied in the determination by the main control unit.

The outputting of the melting signal may include outputting, by the auxiliary control unit, the melting signal via a first line electrically connecting the auxiliary control unit to the fuse and a second line branched off from the first line and electrically connecting a first node to the main control unit, the first node being a branch of the first line and the second line, while a fuse switch provided on the first line connecting the first node to the fuse maintains a turn-off state, and the melting of the fuse may include turning on, by the main control unit, the fuse switch to allow the melting signal outputted from the auxiliary control unit to flow into the fuse.

The measuring of the voltage by the auxiliary control unit may include measuring, by the auxiliary control unit, the voltage of the battery cell, converting, by the auxiliary control unit, the measured voltage value to a digital voltage value, and storing, by the auxiliary control unit, the converted voltage value as a first voltage value.

The measuring of the voltage by the main control unit may include measuring, by the main control unit, the voltage of the battery cell, converting, by the main control unit, the measured voltage value to a digital voltage value, and storing, by the main control unit, the converted voltage value as a second voltage value.

Advantageous Effects

According to one aspect of the present disclosure, the melting of the fuse is not carried out immediately after a melting signal is outputted from the auxiliary control unit, but is carried out only after the battery cell is determined to be overcharged by the main control unit. Accordingly, the present disclosure may significantly reduce the likelihood that the fuse of the battery pack will be melted based on an incorrectly measured voltage value of the battery cell due to an error in the auxiliary control unit. Thus, the present disclosure may minimize an economic loss and a time loss that may occur when the fuse is incorrectly melted and the battery pack becomes unusable.

According to another aspect of the present disclosure, the main control unit may determine whether an error has occurred in the auxiliary control unit, and output a malfunction signal. Accordingly, a battery pack operator may stop charging the battery pack or check the error in the auxiliary control unit.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

MODE FOR CARRYING OUT THE INVENTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 1:
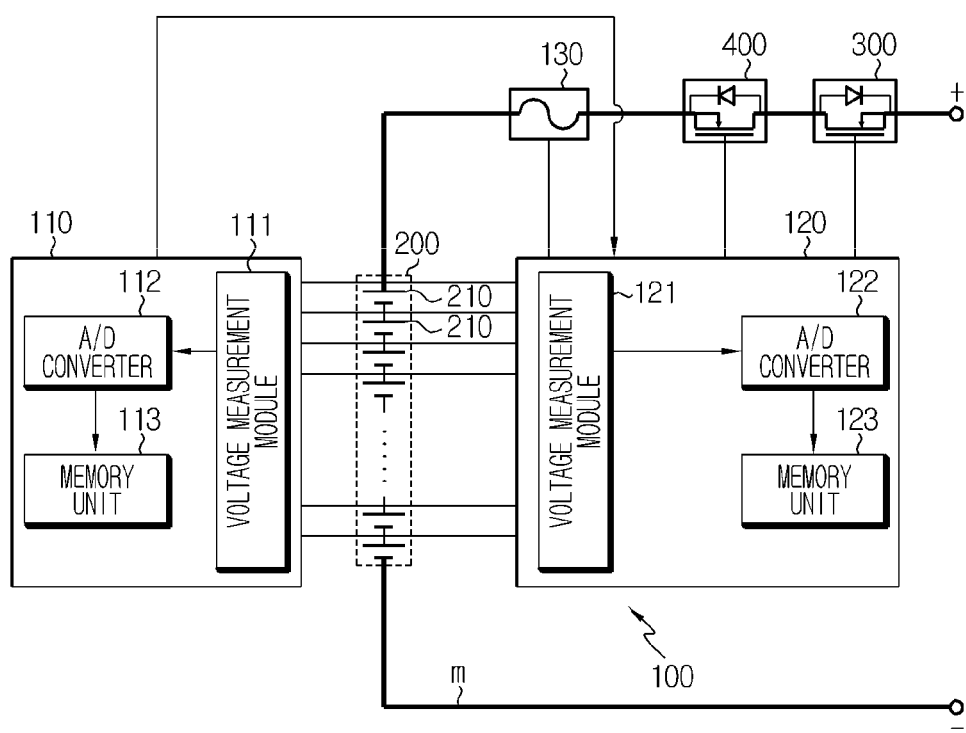
FIG. 1 is a diagram illustrating a battery pack including an apparatus for battery management according to an exemplary embodiment of the present disclosure.

FIG. 1 is a diagram illustrating a battery pack including an apparatus for battery management according to an exemplary embodiment of the present disclosure.

Referring to FIG. 1, the battery pack according to an exemplary embodiment of the present disclosure includes a battery assembly 200 and an apparatus 100 for battery management.

The battery assembly 200 has at least one battery cell 210. That is, the battery assembly 200 represents a single battery cell 210 or an assembly of battery cells 210, and the assembly of battery cells 210 may consist of a plurality of battery cells 210 connected either in series or in parallel, or both.

The battery cell 210 may be a target for voltage measurement by an auxiliary control unit 110 and a main control unit 120 to be described below. That is, the battery cell 210 is electrically connected to the auxiliary control unit 110 and the main control unit 120, and the auxiliary control unit 110 and the main control unit 120 may measure the voltage of the battery cell 210.

In this instance, the battery cell 210 may be embodied as a lithium ion battery, a lithium polymer battery, a nickel-cadmium battery, a nickel-hydrogen battery, a nickel-zinc battery, and the like, that can be charged and used repeatedly. However, the present disclosure is not limited by a type, an output voltage, and a charge capacity of the battery cell, a number of battery cells included in the battery pack, and the like.

The apparatus 100 for battery management includes the auxiliary control unit 110, the main control unit 120, and a fuse 130.

The fuse 130 may be provided on a charge/discharge line (m) of battery pack. The fuse 130 may be irreversibly melted in the event of overcharge of the battery cell 210 or the battery assembly 200 included in the battery pack. The fuse 130 may cuts off the charge/discharge line (m) to disallow charging/discharging when the battery cell 210 is overcharged.

The fuse 130 may be designed to be melted in response to an inflow of an electric current greater than or equal to a threshold current. That is, when a magnitude of the electric current flowing in the fuse 130 is greater than the threshold current, the fuse may be melted.

The auxiliary control unit 110 and the main control unit 120 are electrically connected to the plurality of battery cells 210 included in the battery pack, and may measure the voltage of the battery cells 210.

The auxiliary control unit 110 and the main control unit 120 may include voltage measurement modules 111 and 121, respectively, to measure the voltage of the battery cells 210. Also, the auxiliary control unit 110 and the main control unit 120 may include analog-to-digital (A/D) converters 112 and 122, respectively, to convert electrical signals outputted from the voltage measurement modules 111 and 121 to digital voltage values. Also, the auxiliary control unit 110 and the main control unit 120 may include memory units 113 and 123, respectively, to store the digital voltage values.

The memory units 113 and 123 are a high-capacity storage medium such as a semiconductor device or hard disk that is known as being capable of recording and erasing data, for example, random access memory (RAM), read-only memory (ROM), electrical erasable programmable read-only memory (EEPROM), and the like, and encompasses any device capable of storing information regardless of a device type and is not limited to a specific memory device. Also, the memory units 113 and 123 may be included in the auxiliary control unit 110 and the main control unit 120 as shown in the drawing, or may be placed outside of the auxiliary control unit 110 and the main control unit 120.

The construction and working principles of the voltage measurement modules 111 and 121 and the A/D converters 112 and 122 are well known to those skilled in the art, and their detailed description is omitted herein.

The auxiliary control unit 110 may measure the voltage of the battery cell 210 included in the battery pack. The auxiliary control unit 110 determines whether the battery cell 210 is overcharged, using the measured voltage of the battery cell 210, and when the battery cell 210 is determined to be overcharged, may output a signal for melting the fuse 130, or a melting signal. That is, the auxiliary control unit 110 may output a melting signal when a voltage value of the battery cell 210 measured by the auxiliary control unit 110, or a first voltage value is higher than a preset first reference voltage value. Here, the first reference voltage value refers to a value serving as a reference for determination as to overvoltage. Thus, the first reference voltage value may be variously set based on a type or properties of the battery cell 210. According to an exemplary embodiment of the present disclosure, the melting of the fuse 130 is not carried out immediately after the melting signal is outputted, but is carried out only after additional determination is made by the main control unit 120. To this end, the melting signal outputted from the auxiliary control unit 110 may become an input of the main control unit 120.

The main control unit 120 may measure the voltage of the battery cell 210 included in the battery pack. That is, the main control unit 120 may measure the voltage of the battery cell 210, similar to the auxiliary control unit 110 described in the foregoing. In other words, the main control unit 120 may measure the voltage of the battery cell 210 independently from the auxiliary control unit 110.

Also, the main control unit 120 may determine whether a first condition and a second condition are satisfied. Here, the first condition represents a condition in which a voltage value of the battery cell 210 measured by the main control unit 120, or a second voltage value is higher than a preset second reference voltage value. Here, the second reference voltage value refers to a voltage value serving as a reference for determination as to overcharge similar to the first reference voltage value. The second reference voltage value may be set to have the same value as the first reference voltage value.

Here, the second condition is a condition under which the melting signal outputted from the auxiliary control unit 110 is received.

The main control unit 120 may determine whether the first condition and the second condition are satisfied, and when the first condition and the second condition are all satisfied, may melt the fuse 130. For example, the main control unit 120 is electrically connected to the fuse 130 and may flow an electric current with a magnitude enough to melt the fuse 130 to the fuse.

Preferably, the main control unit 120 may determine whether the first condition is satisfied, after the second condition is satisfied. That is, the main control unit 120 may determine whether the first condition is satisfied, only after receiving the melting signal from the auxiliary control unit

110. In other words, the main control unit 120 may additionally determine whether the battery cell 210 is overcharged, only after the auxiliary control unit 110 determines whether the battery cell 210 is overcharged.

Alternatively, the main control unit 120 may output a malfunction signal when the second condition is satisfied but the first condition is not satisfied. Here, the malfunction signal represents a signal indicating that the auxiliary control unit 110 has malfunctioned.

That is, as a result of the determination as to whether the battery cell 210 is overcharged independently from the auxiliary control unit 110, the main control unit 120 may melt the fuse 130 when the battery cell 210 is determined to be overcharged, as the same with the determination by the auxiliary control unit 110, and may output a malfunction signal indicating that the auxiliary control unit 110 has malfunctioned when the battery cell 210 is not determined to be overcharged, as opposed to the determination by the auxiliary control unit 110.

As an example, the malfunction signal may be outputted to a charger connected to the battery pack to stop charging, and as another example, the malfunction signal may be outputted to a charge switch 300 and/or a discharge switch 400 provided on the charge/discharge line (m) of the battery pack to turn off the charge switch 300 and/or discharge switch 400.

On the charge/discharge path (m) of the battery pack, the charge switch 300 and the discharge switch 400 separate from the fuse 130 may be provided. That is, the battery pack may further include the charge switch 300 and the discharge switch 400. The charge switch 300 and the discharge switch 400 may be embodied as, for example, a field-effect transistor (FET) device as shown in FIG. 1. The charge switch 300 and the discharge switch 400 may primarily perform an overcharge protection function of the battery cell 210, and may be turned on or off by the control of the main control unit 120.

Of the battery pack, charging and discharging terminals (+,−) may be connected to a load that is supplied with power from the battery pack or a charger that supplies a charging power to the battery pack. There is no particular limitation on a type of the load, and the load may include a portable electronic device, for example, a video camera, a mobile phone, a portable PC, a portable media player (PMP), an MP3 player, and the like, a motor of an electric vehicle or hybrid electric vehicle, a DC to DC converter, and the like. Rather, for simplification of the drawings, the load or charger is not illustrated, and the present disclosure is not limited by a type of the load or charger.

Hereinafter, referring back to FIG. 1, the operation of the apparatus 100 for battery management according to an exemplary embodiment of the present disclosure is described.

The auxiliary control unit 110 measures the voltage of the battery cell 210. The auxiliary control unit 110 determines whether the measured first voltage value is higher than the preset first reference voltage value by comparing them. If the first voltage value is higher than the first reference voltage value, the auxiliary control unit 110 outputs a melting signal. In this instance, the fuse 130 is not immediately melted although the melting signal is outputted. The determination as to whether to melt the fuse 130 is made only after the determination is made by the main control unit 120.

As the melting signal outputted from the auxiliary control unit 110 becomes an input of the main control unit 120, when the auxiliary control unit 110 outputs the melting signal, the main control unit 120 receives an input of the melting signal. In response, the second condition is satisfied. The main control unit 120 measures the voltage of the battery cell 210 independently from the auxiliary control unit 110. The main control unit 120 determines whether the measured second voltage value is higher than the preset second reference voltage value by comparing them.

If the second voltage value is higher than the second reference voltage value, the first condition is satisfied.

In this way, when the first condition and the second condition are both satisfied, the main control unit 120 melts the fuse 130. Here, both the first condition and the second condition being satisfied represents that the auxiliary control unit 110 and the main control unit 120 all determine the battery cell 210 is overcharged, and this corresponds to a situation in which reliability in determining as to the overcharge of the battery cell 210 is high.

In contrast, when the second voltage value is not higher than the second reference voltage value, i.e., less than or equal to the second reference voltage value, the first condition is not satisfied.

When the second condition is satisfied but the first condition is not satisfied, the main control unit 120 does not melt the fuse 130. Here, the second condition being satisfied and the first condition being not satisfied represents the auxiliary control unit 110 determines that the battery cell 210 is overcharged, but the main control unit 120 determines that the battery cell 210 is not overcharged. This situation corresponds to a situation in which the auxiliary control unit 110 has malfunctioned. Thus, the main control unit 120 outputs a malfunction signal rather than melting the fuse 130.

Figure 2:
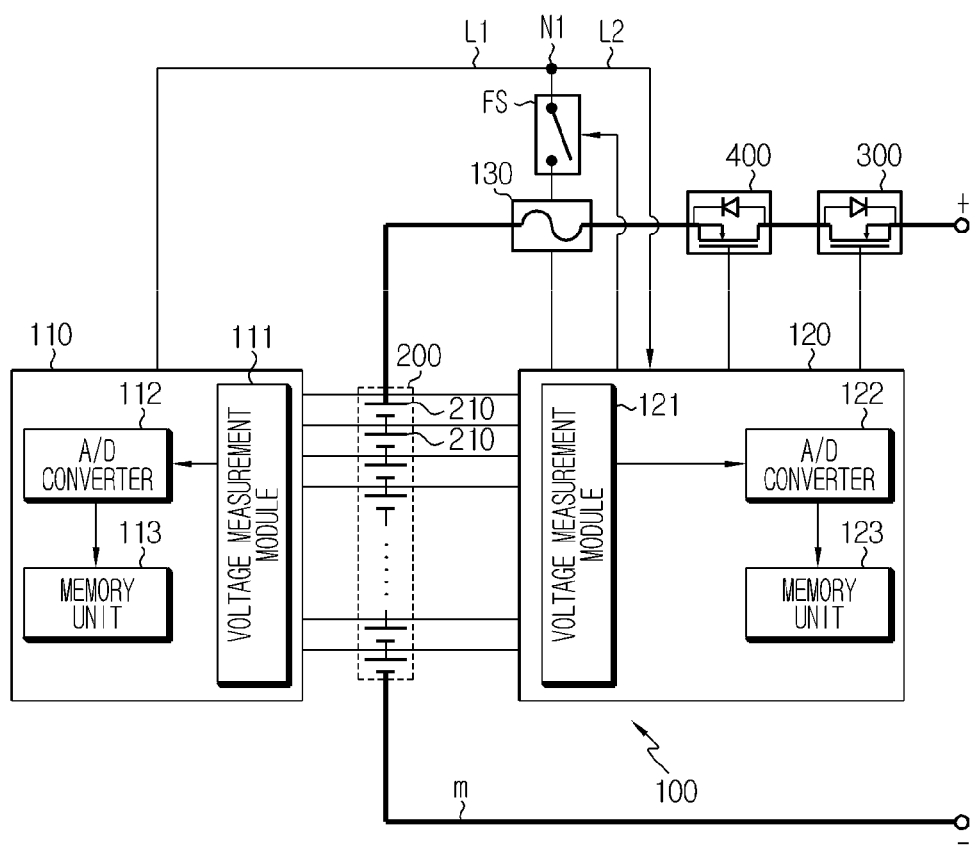
FIG. 2 is a diagram illustrating a battery pack including an apparatus for battery management according to another exemplary embodiment of the present disclosure.

FIG. 2 is a diagram illustrating a battery pack including an apparatus for battery management according to another exemplary embodiment of the present disclosure.

Referring to FIG. 2, the battery pack 100 according to another exemplary embodiment of the present disclosure includes the fuse 130, the auxiliary control unit 110, and the main control unit 120.

Also, the apparatus 100 for battery management according to another exemplary embodiment of the present disclosure further includes a first line L1, a second line L2, and a fuse switch FS.

Here, the first line L1 refers to a line electrically connecting the auxiliary control unit 110 to the fuse 130. Also, the second line L2 is branched off from the first line L1, and refers to a line electrically connecting the first node N1, or a branch of the first line L1 and the second line L2, to the main control unit 120. That is, the auxiliary control unit 110 is electrically connected to the fuse 130 and the main control unit 120 via the first line L1 and the second line L2. In this instance, the auxiliary control unit 110 may output a melting signal via the first line L1 and the second line L2.

The fuse switch FS is provided on the first line L1, particularly, on the first line L1 connecting the first node N1 to the fuse 130. The fuse switch FS is configured to maintain a turn-off state, and turn on by the control of the main control unit 120.

In the apparatus 100 for battery management of FIG. 2 according to another exemplary embodiment of the present disclosure, when the auxiliary control unit 110 outputs a melting signal, the melting signal is inputted into the main control unit 120 via the first line L1, the first node N1, and the second line L2 in a sequential order. Because the fuse switch FS is in a turn-off state, the fuse 130 is not melted although the melting signal is outputted from the auxiliary control unit 110.

However, when the main control unit 120 receives an input of the melting signal (the second condition is satisfied) and as a result of determining whether the battery cell 210 is overcharged, determines that the battery cell 210 is overcharged (the first condition is satisfied), the main control unit 120 turns on the fuse switch FS. As a consequence, the melting signal outputted from the auxiliary control unit 110 may flow into the fuse 130 via the first line L1, the first node N1, and the fuse switch FS, and thereby the fuse 130 is melted. Through this, the likelihood that the fuse 130 is incorrectly melted may reduce. In this instance, the melting signal may correspond to an electrical signal having a current value enough to melt the fuse 130 when the melting signal flows into the fuse 130.

Hereinafter, a description of a method for battery management according to still another exemplary embodiment of the present disclosure is provided. The method for battery management according to still another exemplary embodiment of the present disclosure is a method using the apparatus for battery management described in the foregoing, and the description of the apparatus for battery management is equally applied and an overlapping description is omitted herein.

Figure 3:
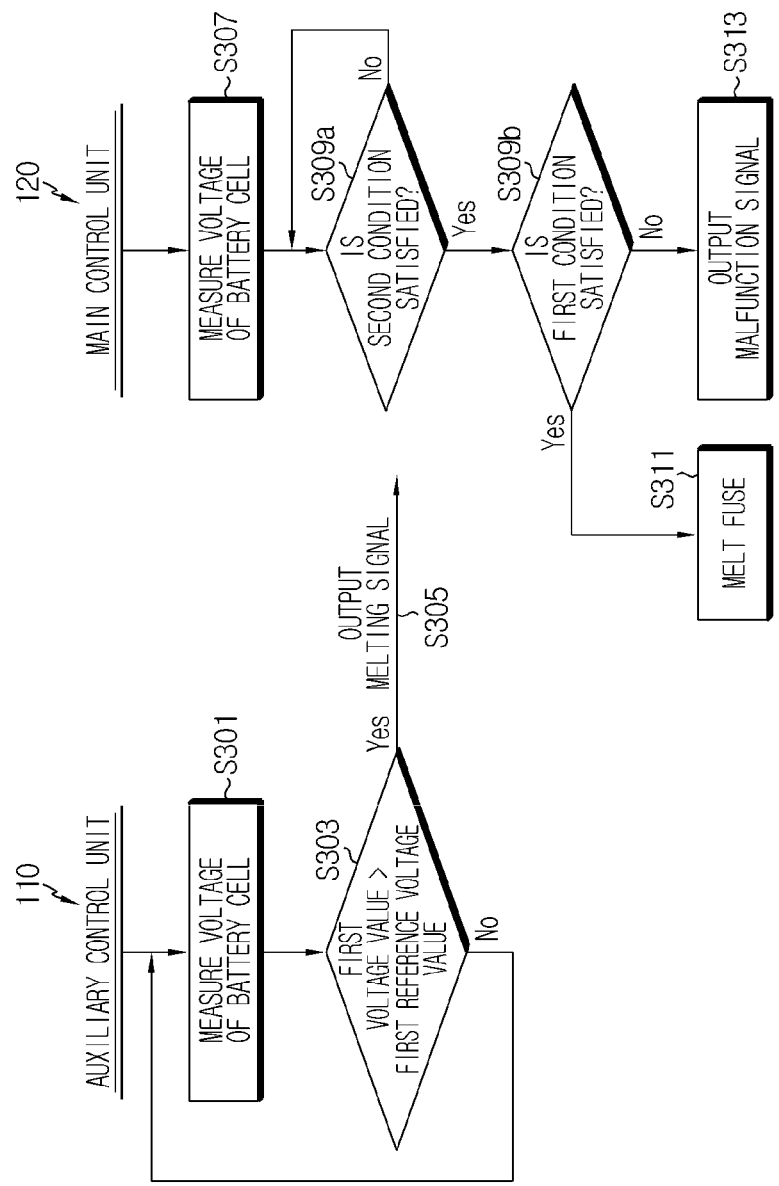
FIG. 3 is a flowchart illustrating a method for battery management according to still another exemplary embodiment of the present disclosure.

FIG. 3 is a flowchart illustrating a method for battery management according to another exemplary embodiment of the present disclosure.

Referring to FIG. 3, the method for battery management according to another exemplary embodiment of the present disclosure is as follows. First, the the auxiliary control unit 110 measures the voltage of the battery cell 210 included in the battery pack (S301). Subsequently, the auxiliary control unit 110 compares a first voltage value, or a voltage value measured by the auxiliary control unit 110, to a preset first reference voltage value (S303). When the first voltage value is not higher than the first reference voltage value, i.e., less than or equal to the first reference voltage value, as a result of comparing the first voltage value to the first reference voltage value by the auxiliary control unit 110, the auxiliary control unit 110 does not perform a separate operation. That is, when the battery cell 210 is not overcharged, the auxiliary control unit 110 does not perform a separate operation. In contrast, when the first voltage value is higher than the first reference voltage value as a result of comparing the first voltage value to the first reference voltage value by the auxiliary control unit 110, the the auxiliary control unit 110 outputs a melting signal, or a signal for melting the fuse (S305).

On the other hand, the main control unit 120 measures the voltage of the battery cell 210 independently from the auxiliary control unit 110 (S307).

Subsequently, the main control unit 120 determines whether the first condition and the second condition are satisfied (S309a and S309b). In the exemplary embodiment of FIG. 3, the determination as to whether the second condition is satisfied precedes the determination as to whether the first condition is satisfied. When the auxiliary control unit 110 outputs a melting signal and the main control unit 120 receives the melting signal from the auxiliary control unit 110, the second condition is satisfied (Yes in S309a).

Then, the main control unit 120 determines whether the first condition is satisfied (S309b). That is, the main control unit 120 compares a second voltage value, or a voltage value measured by the main control unit 120, to a preset second reference voltage value. When the second voltage value is higher than the second reference voltage value as a result of comparing the second voltage value to the second reference voltage value by the main control unit 120, the main control unit 120 melts the fuse 130 (S311). In contrast, when the second voltage value is not higher than the second reference voltage value, i.e., less than or equal to the second reference voltage value, the main control unit 120 outputs a malfunction signal indicating that the auxiliary control unit 110 has malfunctioned (S313).

In this instance, the step (S301) of measuring the voltage by the auxiliary control unit 110 may include a step of measuring the voltage of the battery cell 210, a step of converting the measured voltage value to a digital voltage value, and a step of storing the converted voltage value as a first voltage value. Similarly, the step (S307) of measuring the voltage by the main control unit 120 may include a step of measuring the voltage of the battery cell 210, a step of converting the measured voltage value to a digital voltage value, and a step of storing the converted voltage value as a second voltage value.

The method for battery management according to still another exemplary embodiment of the present disclosure may be performed using the apparatus for battery management of FIG. 2. That is, the method for battery management according to still another exemplary embodiment of the present disclosure may be performed using the apparatus for battery management including the first line L1, the second line L2, and the fuse switch FS.

Specifically, in the step (S305) of outputting the melting signal, the auxiliary control unit 110 outputs the melting signal via the first line L1 and the second line L2 in a state that the fuse switch FS maintains a turn-off state. Thus, the melting signal does not flow into the fuse 130 although the auxiliary control unit 110 outputs the melting signal. The melting signal outputted from the auxiliary control unit 110 flows only into the main control unit 120.

When the main control unit 120 receives the melting signal (S309a Yes), and determines that the second voltage value is higher than the second reference voltage value (S309b Yes), the main control unit 120 melts the fuse 130 (S311). In this instance, a step (S311) of melting the fuse 130 by the main control unit 120 may be performed by turning on the fuse switch FS by the main control unit 120. That is, a step (S311) of melting the fuse includes melting the fuse 130 by turning on the fuse switch FS to allow the melting signal outputted from the auxiliary control unit 110 to flow into the fuse 130.

To execute various control logics described in the foregoing, the auxiliary control unit 110 and the main control unit 120 may include a processor, an application-specific integrated circuit (ASIC), other chipsets, a logic circuit, a register, a communication modem, a data processing device, and the like, known in the art pertaining to the present disclosure. Also, when the exemplary control logics are implemented as software, the auxiliary control unit 110 and the main control unit 120 may be implemented as an assembly of program modules. In this instance, the program module may be stored in a memory and executed by a processor. Here, the memory may be inside or outside the processor, and connected to the processor by various well-known means. Also, the memory may be inside or outside the memory units 113 and 123. The memory collectively refers to a device used to store information regardless of a device type, and is not limited to a specific memory device.

As described in the foregoing, the apparatus 100 for battery management may be one component of a battery pack including a battery assembly 200 consisting of a plurality of battery cells 210 connected in series or in parallel and a system for charging/discharging control of the battery assembly 200. In this case, the apparatus 100 for battery management may be integrated with the system for charging/discharging control of the battery assembly 200, and may be implemented as a separate circuit device.

Also, the apparatus 100 for battery management may be one component of an energy storage system including a plurality of battery packs.

Also, the apparatus 100 for battery management may be one component of a battery charging system including a battery pack and a charger to supply power to the battery pack.

Also, the apparatus 100 for battery management according to the present disclosure may be one component of a battery operating system including a battery pack and a load that is supplied with power from the battery pack.

The battery operating system may include, for example, an electric vehicle (EV), a hybrid vehicle (HEV), an electric bike (E-Bike), a power tool, an energy storage system including a plurality of battery packs, an uninterruptible power supply (UPS), a portable computer, a mobile phone, a portable audio device, a portable video device, and the like, and the load may include, for example, a motor that generates a rotational force by power supplied from the battery pack, or a power inverter circuit that inverts power supplied from the battery pack to power required for various circuit components.

According to one aspect, the present disclosure may significantly reduce the likelihood that the fuse of the battery pack will be melted based on a voltage value of a battery cell to which an error has occurred. Accordingly, the present disclosure may avoid an economic loss and a time loss that may occur when the fuse is incorrectly melted and the battery pack becomes unusable.

In the description of the present disclosure, it should be understood that each element of the apparatus for battery management according to the present disclosure shown in the drawings is distinguished logically rather than physically.

That is, each element corresponds to a logic element to realize the technical spirit of the present disclosure, and accordingly, even though each element is integrated or separated, it should be construed as falling within the scope of the present disclosure if a function performed by a logic element of the present disclosure can be implemented, and it should be understood that it falls within the scope of the present disclosure regardless of whether names are identical or not if it is an element performing an identical or similar function.

While the present disclosure has been hereinabove described in connection with only a limited number of embodiments and drawings, the present disclosure is not limited thereto and it should be understood that various changes and modifications may be made by an ordinary person skilled in the art within the spirit and scope of the disclosure and the appended claims and their equivalents.

What is claimed is:

1. An apparatus for battery management, comprising:
    a fuse provided on a charge/discharge line of a battery pack;
    an auxiliary control unit configured to measure a first voltage value of a battery cell included in the battery pack, and when the measured first voltage value is higher than a preset first reference voltage value, output a melting signal for melting the fuse; and
    a main control unit configured to measure a second voltage value of the battery cell included in the battery pack, and when a first condition is satisfied and a second condition is satisfied, to melt the fuse, the first condition in which the measured second voltage value is higher than a preset second reference voltage value and the second condition in which the melting signal is received from the auxiliary control unit.

2. The apparatus for battery management according to claim 1, wherein the main control unit is configured to determine whether the first condition is satisfied, after the second condition is satisfied.

3. The apparatus for battery management according to claim 1, wherein the main control unit is configured to output a malfunction signal indicating that the auxiliary control unit has malfunctioned, when the second condition is satisfied and the first condition is not satisfied.

4. The apparatus for battery management according to claim 1, further comprising:
    a first line electrically connecting the auxiliary control unit to the fuse;
    a second line branched off from the first line, the second line electrically connecting a first node to the main control unit, the first node being a branch of the first line and the second line; and
    a fuse switch provided on the first line connecting the first node to the fuse, the fuse switch being turned on by the control of the main control unit,
    wherein the main control unit is configured to turn on the fuse switch to allow the melting signal outputted from the auxiliary control unit to flow into the fuse to melt the fuse, when the first condition and the second condition are satisfied.

5. The apparatus for battery management according to claim 1, wherein the auxiliary control unit comprises:
    a voltage measurement module configured to measure the voltage of the battery cell;
    an analog-to-digital (A/D) converter configured to convert the measured voltage value to a digital voltage value; and
    a memory unit configured to store the measured voltage value and a preset reference voltage value.

6. The apparatus for battery management according to claim 1, wherein the main control unit comprises:
    a voltage measurement module configured to measure the voltage of the battery cell;
    an A/D converter configured to convert the measured voltage value to a digital voltage value; and
    a memory unit configured to store the measured voltage value and a preset reference voltage value.

7. A battery pack comprising:
    an apparatus for battery management according claim 1; and
    a plurality of battery cells connected in series or in parallel.

8. An energy storage system comprising:
    a battery pack according to claim 7.

9. A battery charging system comprising:
    a battery pack according to claim 7; and
    a charger to supply power to the battery pack.

10. A battery operating system comprising:
    a battery pack according to claim 7; and
    a load which is supplied with power from the battery pack.

11. A method for battery management, comprising:
    measuring, by an auxiliary control unit, a first voltage value of a battery cell included in a battery pack, outputting, by the auxiliary control unit, a melting signal for melting a fuse when the measured first voltage value is higher than a preset first reference voltage value;

measuring, by a main control unit, a second voltage value of the battery cell included in the battery pack;

determining, by the main control unit, whether a first condition is satisfied and a second condition is satisfied, the first condition in which the measured second voltage value is higher than a preset second reference voltage value and the second condition in which the melting signal is received from the auxiliary control unit; and melting, by the main control unit, the fuse when the first condition and the second condition are satisfied.

12. The method for battery management according to claim 11, wherein the determining by the main control unit comprises determining whether the first condition is satisfied, after the second condition is satisfied.

13. The method for battery management according to claim 11, further comprising:

outputting, by the main control unit, a malfunction signal indicating that the auxiliary control unit has malfunctioned, when the second condition is satisfied and the first condition is not satisfied in the determination by the main control unit.

14. The method for battery management according to claim 11, wherein the outputting of the melting signal comprises outputting, by the auxiliary control unit, the melting signal via a first line electrically connecting the auxiliary control unit to the fuse and a second line branched off from the first line and electrically connecting a first node to the main control unit, the first node being a branch of the first line and the second line, while a fuse switch provided on the first line connecting the first node to the fuse maintains a turn-off state, and the melting of the fuse comprises turning on, by the main control unit, the fuse switch to allow the melting signal outputted from the auxiliary control unit to flow into the fuse.

15. The method for battery management according to claim 11, wherein the measuring of the voltage by the auxiliary control unit comprises:

measuring, by the auxiliary control unit, the voltage of the battery cell;

converting, by the auxiliary control unit, the measured voltage value to a digital voltage value; and storing, by the auxiliary control unit, the converted voltage value as a first voltage value.

16. The method for battery management according to claim 11, wherein the measuring of the voltage by the main control unit comprises:

measuring, by the main control unit, the voltage of the battery cell;

converting, by the main control unit, the measured voltage value to a digital voltage value; and storing, by the main control unit, the converted voltage value as a second voltage value.

* * * * *